United States Patent [19]

Ohmura et al.

[11]  4,377,652

[45]  Mar. 22, 1983

[54] POLYAMIDE-IMIDE COMPOSITIONS AND ARTICLES FOR ELECTRICAL USE PREPARED THEREFROM

[75] Inventors: Kaoru Ohmura; Ichiro Shibasaki; Takeo Kimura, all of Fuji, Japan

[73] Assignee: Asahi Kasei Kogyo Kabushiki Kaisha, Osaka, Japan

[21] Appl. No.: 10,290

[22] Filed: Feb. 8, 1979

[30] Foreign Application Priority Data

| Feb. 17, 1978 | [JP] | Japan | 53-16612 |
| Apr. 28, 1978 | [JP] | Japan | 53-51214 |
| May 25, 1978 | [JP] | Japan | 53-61637 |
| May 25, 1978 | [JP] | Japan | 53-62604 |
| May 25, 1978 | [JP] | Japan | 53-62605 |
| Jul. 21, 1978 | [JP] | Japan | 53-88363 |
| Jul. 21, 1978 | [JP] | Japan | 53-88364 |
| Jul. 21, 1978 | [JP] | Japan | 53-88365 |
| Jul. 21, 1978 | [JP] | Japan | 53-88367 |
| Jul. 24, 1978 | [JP] | Japan | 53-89391 |
| Jul. 24, 1978 | [JP] | Japan | 53-89392 |
| Jul. 27, 1978 | [JP] | Japan | 53-89393 |
| Jul. 27, 1978 | [JP] | Japan | 53-90933 |
| Jul. 27, 1978 | [JP] | Japan | 53-90934 |

[51] Int. Cl.$^3$ ............... C08G 73/14; C08L 79/08
[52] U.S. Cl. ............... 524/104; 524/148; 524/173; 524/233; 524/403; 524/404; 524/408; 524/430; 524/432; 524/433; 524/435; 524/436; 524/437; 524/439; 524/440; 524/441; 524/600; 525/423; 525/430; 528/125; 528/128; 528/172; 528/184; 528/185; 528/350; 528/352

[58] Field of Search ............ 528/350, 352, 172, 125, 528/128, 184, 185; 260/37 N, 37 M, 32.6 N, 30.2, 30.8 DS, 30.6 R; 525/423, 430; 524/403, 404, 406, 408, 430, 432, 433, 435, 436, 437, 439, 440, 441, 600, 104, 148, 173, 233

[56] References Cited

U.S. PATENT DOCUMENTS

| 3,472,815 | 10/1969 | Juveland | 528/350 |
| 3,513,134 | 5/1970 | Filius | 528/350 |
| 3,753,998 | 8/1973 | Morello | 528/350 |
| 3,817,942 | 6/1974 | Kovacs et al. | 528/350 |
| 3,860,559 | 1/1975 | Minami et al. | 528/350 |
| 3,975,345 | 8/1976 | Fessler | 528/350 |
| 4,066,631 | 1/1977 | Dimmig | 528/350 |
| 4,167,620 | 9/1979 | Chen | 528/350 |

Primary Examiner—Lester L. Lee
Attorney, Agent, or Firm—Sprung, Horn, Kramer & Woods

[57] ABSTRACT

An article for electrical use such as insulative substrates, electrical circuit borads and electrical elements, wholly or partly consisting out of an aromatic polyamide-imide having a reduced viscosity of from about 0.3 to 1.5, which polyamide-imide may contain a granular material dispersed therein, and a composition comprising 100 parts by weight of said polyamide-imide and additional about 100 to 4,000 parts by weight of a granular material and optionally about 10 to 10,000 parts by weight of a polar organic solvent.

26 Claims, No Drawings

POLYAMIDE-IMIDE COMPOSITIONS AND ARTICLES FOR ELECTRICAL USE PREPARED THEREFROM

BACKGROUND OF THE INVENTION

1. Field of the Invention

This invention relates to articles for electrical use, wholly or partly consisting out of a composition comprising an aromatic polyamide-imide and having excellent thermal resistance, humidity resistance, storage stability and electrical characteristics.

2. Description of the Prior Art

Recently, large integration and high reliability have been particularly required of electronic parts, and the development of materials having excellent thermal resistance, humidity resistance, adhesion and electrical characteristics which can be applied to the construction electronic parts has been desired, primarily because most of the known synthetic resins used for this purpose become unstable at temperatures above 250° C. as their softening points are exceeded or their decomposition points approached. As such materials, the use of thermal resistance polymers may be considered. In general, however, thermal resistance polymers are insoluble in most solvents and must be used in the form of their precursors. For example, aromatic polyamide acids which are known as thermal resistance polymers are susceptible to hydrolysis and inferior in storage stability or must be converted by heat treatment into aromatic polyimides or aromatic polyamide-imides having thermal resistance at a temperature around 300° C. Accordingly, these aromatic polyamide acids cannot be applied to electronic parts which are affected by heat treatment. Further, contamination is caused by the low molecular weight compounds formed upon heat treatment.

Although polyimides and polyamide-imides which are partially soluble in solvents are also known, the practical features of most of the polyimides and polyamide-imides, such as thermal resistance, humidity resistance and adhesion are inferior. Also, those polyimides and polyamide-imides synthesized at a temperature above 150° C. are subject to partial hydrolysis and crosslinking, and it is difficult to obtain linear polymers having a reduced viscosity sufficient for producing the above described practical features.

Further, compositions comprising silver particles and glass frits are known as compositions possessing electrical characteristics. However, these compositions finally require firing at a high temperature of about 500° to 1000° C. Consequently it is difficult to obtain high accuracy and cost becomes high. Moreover, these compositions cannot be applied to substrates except thermal resistance substrates such as ceramics, nor to substrates mounted with electrical elements.

SUMMARY OF THE INVENTION

An object of this invention is to provide articles comprising aromatic polyamide-imide and having electrical characteristics such as electrical conduction, electrical resistance, dielectric or insulation whose accuracy and reliability are high.

According to this invention a variety of substrates are provided such as insulative substrates, boards for circuits, electrically conductive circuit boards, electrically resistant circuit boards, multi-layer circuit boards, hybrid circuit boards, mounting circuit boards and a variety of electrical elements obtained by using a composition comprising an aromatic polyamide-imide as an electrically conductive material, an electrically resistant material, a dielectric or insulative material, a protective material or a bonding material.

Accordingly, the present invention in one embodiment provides an article for electrical use, wholly or partly consisting out of an aromatic polyamide-imide having a reduced viscosity of from about 0.3 to 1.5 and repeating units of the formula,

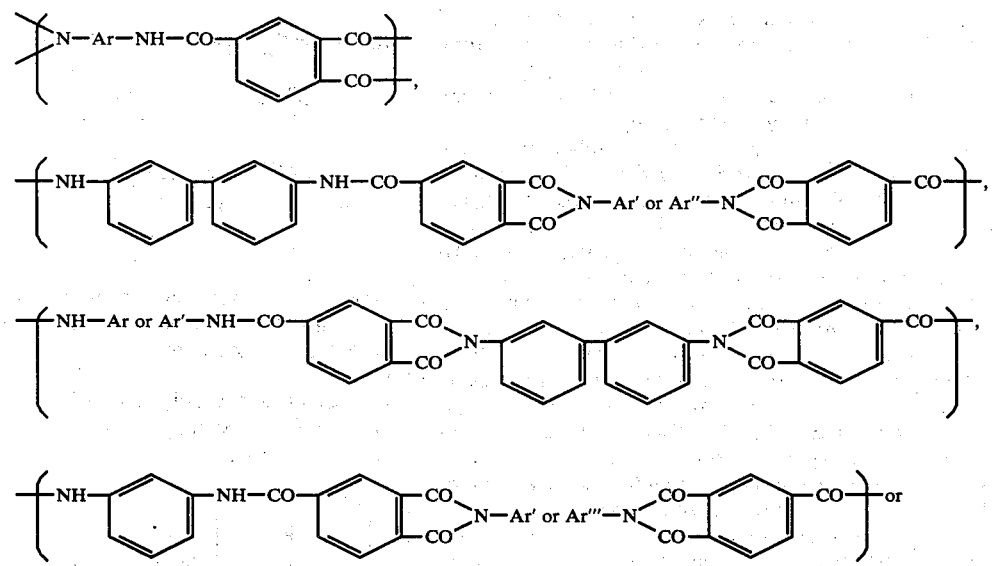

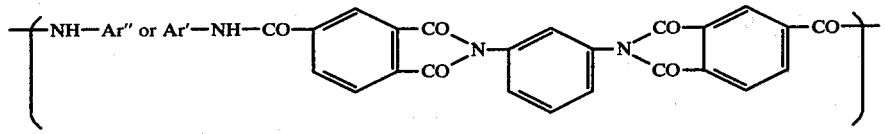

wherein Ar is a divalent residue represented by the formula,

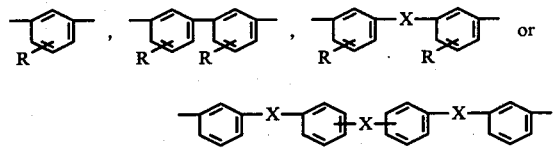

Ar' is a divalent residue represented by the formula,

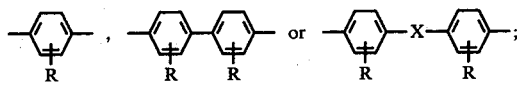

Ar" is a divalent residue represented by the formula,

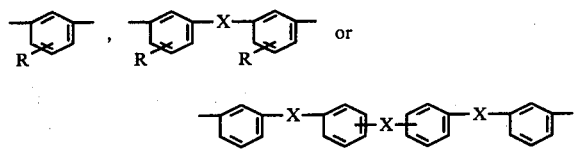

and Ar'" is a divalent residue represented by the formula,

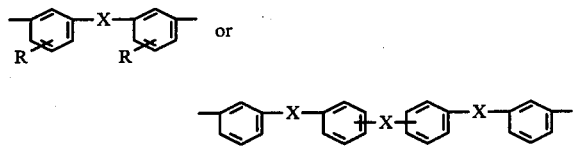

wherein R moieties may be the same or different and represent a hydrogen atom, a halogen atom or an alkyl group having 1 to 4 carbon atoms; X is an oxygen atom, a sulfur atom, a sulfonyl group, a carbonyl group, a carbonyloxy group, a methylene group, an ethylene group or a dimethylmethylene group.

The present invention in another embodiment provides a composition comprising 100 parts by weight of an aromatic polyamide-imide as described above and about 100 to 4,000 parts by weight of a granular material uniformly dispersed therein which imparts electrical characteristics as desired to the article.

In a further embodiment, the invention provides a composition comprising 100 parts by weight of an aromatic polyamide-imide as described above, about 10 to 10,000 parts by weight of at least one polar organic solvent selected from the group consisting of N,N-dimethylformamide, N,N-dimethylacetamide, dimethyl sulfoxide, N-methyl-2-pyrrolidone and hexamethylphosphoramide and about 100 to 4,000 parts by weight of a granular material as described above.

In an even further embodiment, the invention provide various substrates such as insulative substrates, boards or circuits, electrically conductive circuit boards, electrically resistant circuit boards, multi-layer circuit boards, hybrid circuit boards, mounting circuit boards and various electrical elements such as condensers and electronic elements like integrated circuits, passive elements, active elements and conversion elements obtained by using a composition as described above.

Of the aromatic polyamide-imides as used in this invention, preferred ones are those in which Ar in the formulae as described above is:

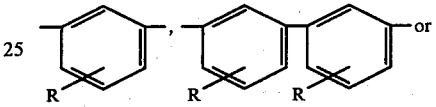

Ar' is: 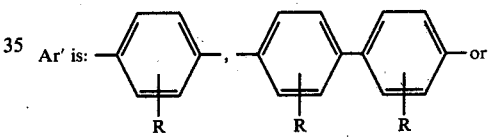

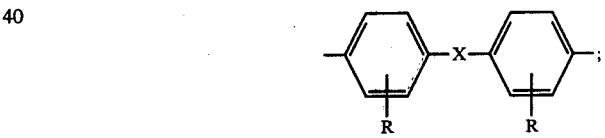

Ar" is: 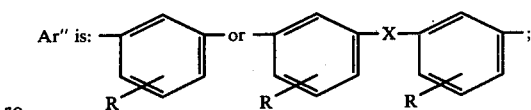

Ar'" is: 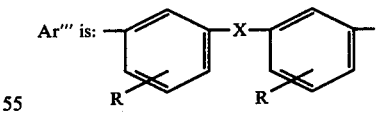

wherein R is a hydrogen atom or a methyl group; and X is an oxygen atom, a sulfur atom, a sulfonyl group, a carbonyl group, a methylene group or an ethylene group.

More preferred polyamide-imides are those in which Ar in the formulae as described above is

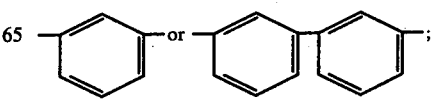

Ar' is —⌬—O—⌬— or —⌬—⌬—; and

Ar'' is —⌬—.

The aromatic polyamide-imides employed in this invention are preferably prepared in an organic solvent at a temperature below about 150° C. When the preparation of the aromatic polyamide-imides is conducted at temperatures above 150° C., partial hydrolysis and crosslinking occur and as a result linear polymers having sufficient reduced viscosity for practical use cannot be obtained. Accordingly, the preferred aromatic polyamide-imide employed in this invention are linear polymers having a reduced viscosity of from about 0.3 to 1.5, preferably from about 0.4 to 1.3 which have been prepared at a temperature below about 150° C., preferably below about 130° C. When the reduced viscosity of the aromatic polyamide-imides is less than 0.3, the strength of a laminate or a coating used as a protective material or an encapsulation material is low and other practical features are also insufficient and, most important of all, reliability is reduced. When the reduced viscosity is higher than 1.5, it becomes difficult to obtain a solution of a high concentration and thus the workability is decreased.

The reduced viscosity of the aromatic polyamide-imide as used throughout this specification is measured at a concentration of 0.05 g of the aromatic polyamide-imide per 10 ml of N,N-dimethylformamide at 30° C.

More specifically, the aromatic polyamide-imides used in this invention can be prepared by (a) reacting an aromatic diamine of the formula,

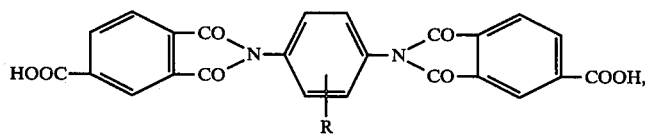

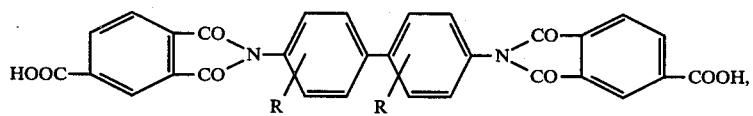

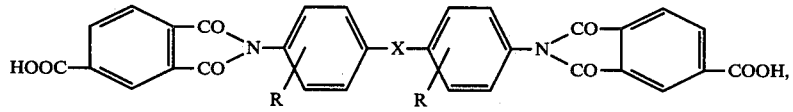

with trimellitic anhydride monoacid chloride in a polar organic solvent at a temperature ranging from about 0° C. to about 150° C. in the presence of a dehydrochlorination agent and a dehydration agent such as acetic anhydride-pyridine; (b) reacting a bisimidedicarboxylic acid of the formula,

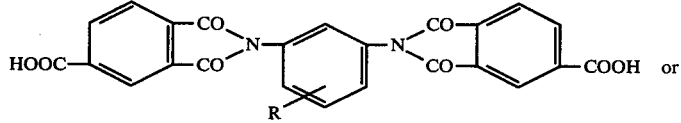

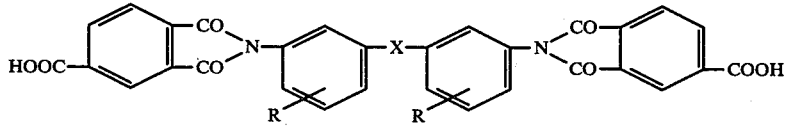

with diphenyl-3,3'-diisocyanate or m-phenylene diisocyanate in a polar organic solvent at a temperature ranging from about 100° C. to about 150° C. or (c) reacting an aromatic diisocyanate of the formula, OCN—(Ar, Ar' or Ar'')—NCO with a bisimidedicarboxylic acid of the formula,

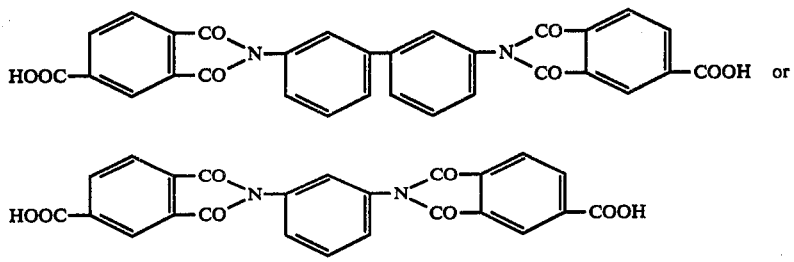

in an organic solvent at a temperature ranging from about 100° C. to about 150° C.

In the above described formulae, R, X, Ar, Ar' and Ar" are the same as defined above.

The polar organic solvents which can be employed in the preparation of the aromatic polyamide-imides to be used in this invention by the above described methods (a), (b) and (c) include N,N-dimethylformamide, N,N-dimethylacetamide, dimethyl sulfoxide, N-methyl-2-pyrrolidone, hexamethylphosphoramide and any mixtures thereof.

Suitable dehydrochlorination agents employed in the above described method (a) include aliphatic tertiary amines such as trimethylamine, triethylamine, tri-n-propylamine, tri-n-butylamine, tri-sec-propylamine, allyldiethylamine, dimethyl-n-butylamine, diethyl-isopropylamine, benzyldimethylamine, di-n-octylbenzylamine, di-n-octyl-chlorobenzylamine, dimethylcyclohexylamine, dimethylphenethylamine, benzylmethylethylamine, (chlorophenethyl)bromobenzylamine, 1-dimethylamino-2-phenylpropane and 1-dimethylamino-4-pentane; cyclic tertiary amines such as pyridine, quinacridines, N-methylpyrrole, N-methylpyrrolidine, N-methylpiperidine, quinoline, isoquinoline, N-methyltetrahydroquinoline, N-methyltetrahydroisoquinoline and N-methylmorpholine; aromatic tertiary amines such as N,N-dimethylaniline and methyldiphenylamine; and any mixtures thereof. These dehydrochlorination agents can be used in an amount sufficient to neutralize the hydrogen chloride formed.

The total amount of the reactants based on the weight of the polar organic solvent which can be preferably employed in these methods (a), (b) and (c) ranges from about 1 to about 20% by weight.

The reduced viscosity of the aromatic polyamide-imides can be controlled by the amount of reactants to be reacted. In order to obtain a higher reduced viscosity the reactants are used in an equimolar amount. When one reactant is used more than the other reactant, polymerization is suppressed, and accordingly the reduced viscosity of the aromatic polyamide-imide thus obtained can be controlled. Further, it is possible to control the reduced viscosity by capping the terminals of the aromatic polyamide-imide with a terminating agent such as phthalic anhydride.

Methods of preparing these aromatic polyamide-imides are described in detail in Japanese Patent Publication Nos. 35076/1974, 41120/1974 and 42920/1974.

The aromatic polyamide-imides used in this invention are soluble in N,N-dimethylformamide, N,N-dimethylacetamide, dimethyl mixture thereof. Of these polar organic solvents, N-methyl-2-pyrrolidone, hexamethylphosphoramide and any mixed solvent containing at least about 5 percent by weight of N-methyl-2-pyrrolidone or hexamethylphosphoramide are preferred from the standpoint of practical features such as thermal resistance, humidity resistance, adhesion, electrical characteristics, as well as workability such as storage stability, coatability, laminatability and printability due to the crystallinity and internal stress of the aromatic polyamide-imides and the wettability of the compositions to articles to be applied therewith.

The amount of the polar organic solvent which can be employed in this invention typically ranges from about 10 to 10,000 parts by weight per 100 parts by weight of the aromatic polyamide-imide. A preferred amount of the polar organic solvent ranges from about 20 to 2,000 parts by weight per 100 parts by weight of the aromatic polyamide-imide. When the amount of the polar organic solvent is less than 10 parts by weight, the processability and the adhesion of the composition are reduced. When the amount is more than 10,000, the workability and the adhesion of the composition are reduced and pinholes are easily produced. Especially when the amount ranges from about 20 to 200 parts by weight per 100 parts by weight of the aromatic polyamide-imide, the composition thus obtained becomes solid or semi-solid and can be melted by heating and, as a result, can be shaped, molded or bonded by heating. The temperature of heating for shaping, molding or bonding such a composition is typically from about 50° to 300° C. and preferably from about 100° to 200° C.

In the present invention the granular materials which can be dispersed in the aromatic polyamide-imide or in a composition comprising the aromatic polyamide-imide and the polar organic solvent to impart electrical characteristics thereto as specified include any materials capable of rendering the aromatic polyamide-imide or the composition electrically conductive, electrically resistant and dielectric or insulative.

In general, the shape or form of these granular materials may be spherical, square, needle-shaped or flaky if they are fine particles. The particle size of the granular materials typically ranges from about 20 Å to 500μ.

Suitable granular materials which can be employed in this invention include metals, metal oxides, metal nitrides, metal carbides, metal silicides, silicon, silicon oxide, silicon nitrides, silicon carbides, boron, boron nitrides, carbon and mixtures thereof.

Specific examples of suitable granular materials include Au, Ag, Pd, Ru, Pt, Rh, Ir, Tl, Mo, Zn, Mn, Mg, Cd, Cr, Nb, Ge, Zr, Cu, Ni, Al, Sn, Pb, Bi, In, Fe, Co, Ti, W, Ta, Hf, Zr, Y, Ba, Be, Si, C, B, alloys thereof, oxides, nitrides, carbides and silicides thereof and mixtures thereof.

Of these materials, the materials which are preferably used as electrically conductive granular materials, used in this invention include, Au, Ag, Pd, Pt, Cu, Ni, Al, Sn, Mo, Mn, Co, W, alloys thereof and mixtures thereof. Of these electrically conductive granular materials, Au, Ag, Pd, Pt, Cu, Ni, Al, Sn, alloys thereof and mixtures thereof are more preferred.

The electrically resistant granular mixtures which can be preferably used in this invention include, Ag—PdO, Ag—PdO—Pd, NiO$_2$—Ag, C—B—Ag, Ag—PdO—Sb$_2$O$_3$, C—B, Cu$_2$O—CuO, In$_2$O$_3$, In$_2$O$_3$—Sb$_2$O$_3$, Tl$_2$O$_3$, SnO$_2$, SnO$_2$—Sb$_2$O$_3$, SnO$_2$—Ta$_2$O$_5$, MoO$_3$—B, ZnO, CdO—ZnO, IrO$_2$, RhO, RuO$_2$, TaN, TiN, TiN—Ti, TaN—Ta, WC, WC—W, C, CoSi, ZrSi, TaSi, MnSi, MoSi, NiSi, TiSi and mixtures thereof.

The electrically insulative or dielectrical granular materials which are preferably used in this invention include, SiO, SiO$_2$, Si$_3$N$_4$, SiC, Ta$_2$O$_3$, Al$_2$O$_3$, TiO$_2$, HfO$_2$, ZrO$_2$, Y$_2$O$_3$, BaTiO$_3$, BN, BeO, CoO, PdO, B$_2$O$_3$, Bi$_2$O$_3$, BaO and mixtures thereof. Of these materials, SiO, SiO$_2$, Si$_3$N$_4$, SiC, Ta$_2$O$_3$, Al$_2$O$_3$, TiO$_2$, BaTiO$_3$, BN, BeO, CoO, PdO, B$_2$O$_3$, Bi$_2$O$_3$, BaO and mixtures thereof are more preferred.

The amount of the granular material which can be employed in this invention typically ranges from about 100 to 4,000 parts by weight per 100 parts by weight of the polyamide-imide. A preferred amount of the granular material ranges from about 200 to 2,000 parts by weight per 100 parts by weight of the polyamide-imide. When the amount of the granular material is less than 100 parts by weight, desirable electrical properties such as conductivity, resistance and the desirable dielectric properties cannot be obtained. On the other hand, when the amount of the granular material is more than 4,000 parts by weight in the case where the solvent is not employed, cracks are disadvantageously formed.

If necessary or desired, the compositions of this invention may additionally contain a silane coupling agent and/or an epoxy resin for improving dispersibility of the granular material and adhesion of the compositions to articles to be applied therewith.

A suitable amount of the silane coupling agent is from about 2 to 60 parts by weight per 100 parts by weight of the aromatic polyamide-imide and a suitable amount of the epoxy resin is from about 2 to 100 parts by weight. If the amount of the silane coupling agent or the epoxy resin is less than 2 parts by weight, the effect of using these materials cannot be observed. With amounts larger than 60 parts by weight of the coupling agent or 100 parts by weight of the epoxy resin, the thermal resistance is decreased.

The epoxy resins which can be used in this invention include any of the epoxy resins conventionally used for this purpose. Suitable examples of epoxy resins which can be used include those as disclosed in Hiroshi Kakiuchi as editor, *Epoxy Resins,* Chapters 3 & 4, Shokodo (1970). Such epoxy resins have at least two epoxy groups on the average per molecule and, as the residue or main chain, a carbon chain through an ether bond, an ester bond or an amino bond.

Suitable epoxy resins are obtained by reaction of a polyhydric alcohol such as ethylene glycol, glycerin, trimethylolpropane; a polyhydric phenol such as resorcinol, hydroquinone, catechol, fluoroglycinol; a polyphenol such as 2,2-bis(4-hydroxyphenyl)propane, 4,4'-dihydroxydiphenylmethane, novolak resin; a polycarboxylic acid such as p-hydroxybenzoic acid, terephthalic acid; or an amine such as o-toluidine; and excess amount of an epoxide such as epichlorohydrin, an alkylene oxide.

Many examples of these epoxy resins are described in U.S. Pat. No. 2,592,560. More specifically, the epoxy resin obtained by reaction of Bisphenol A and epichlorohydrin and represented by the formula:

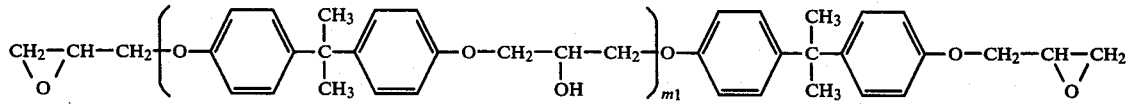

wherein m$_1$ is a number of 0 to 20, and a novolak-type epoxy resin obtained by reaction of a novolak resin and epichlorohydrin, represented by the formula:

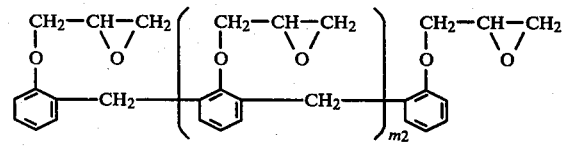

wherein m$_2$ is number of 0 to 5, are preferably employed in this invention.

The composition of this invention comprising the granular material capable of imparting electrical characteristics thereto can be prepared by mixing the granular material obtained by pulverization, vacuum evaporation or chemical precipitation with the aromatic polyamide-imide and the polar organic solvent and dispersing the granular material into the polyamide-imide by stirring until the polyamide-imide is completely dissolved in the polar organic solvent. A ball mill can be used for dispersing. In this invention the granular material should be uniformly dispersed in the aromatic polyamide-imide and the polar organic solvent in such a manner as not to form lumps of the granular material. If necessary, when the solvent is removed from the composition thus obtained by evaporation, heat treatment or other methods, composition comprising the uniformly dispersed granular material will be obtained.

All of the compositions of this invention or to be used in this invention can be prepared at a temperature as low as around 100° C.

According to this invention, boards for circuits, electrically conductive circuit boards, electrically resistant boards, insulative substrates, multi-layer circuit boards, hybrid circuit boards, mounting circuit boards, condenser and electrical elements such as integrated circuits, passive elements, active elements and conversion elements can be prepared using the compositions of this invention.

The term "board for circuits" as used in the description of this invention denotes a base material whose entire surface is formed of a metal foil.

The term "circuit board" denotes a base material having only circuit thereon.

The term "electrically conductive circuit board" used herein denotes a base material on which an electrically conductive circuit is formed.

The term "electrically resistant circuit board" used herein denotes a base material having an electrically resistant circuit thereon.

The term "multi-layer circuit board" used herein denotes a base material having at least two electrically conductive circuits or at least two electrically resistant circuits through an insulation layer thereon.

The term "electrical element" used herein denotes an IC, a passive element, an active element and a conversion element, such as a monolithic IC, a hybrid IC, a resistor, a condenser, a coil, a diode, a transistor, a galvanomagnetic element, a photoelectric element, thermoelectric element, a piezoelectric element and a display element.

The term "mounting circuit board" used herein denotes a circuit board mounted with at least one electrical element thereon.

The term "hybrid circuit board" used herein denotes a base material having at least one electrically conductive circuit and at least one electrically resistant circuit thereon.

The insulative substrate can be prepared, for example, by impregnating a sheet of paper or a base material formed of glass fibers, glass cloth or carbon fibers with a composition comprising the aromatic polyamide-imide and the polar organic solvent or the composition additionally comprising an insulative granular material and laminating a plurality of the impregnated base materials together, or by coating the composition over the entire surface of a base material such as a metal, plastics, glass or ceramic or coating or printing the composition pattern-wise on the base material, or by laminating a film obtained by removing the polar organic solvent from the composition over the entire surface of the base material or pattern-wise on the base material; or by molding the composition in a desired mold.

The board for circuits can be prepared, for example, by adhering a metal foil capable of being etched (e.g., copper foil) to the entire surface of a base material (e.g., a plastic film like a polyimide film) with the composition comprising the aromatic polyamide-imide and the polar organic solvent or the composition of this invention additionally comprising the insulative granular material. By etching the metal foil thus adhered in a desired pattern, there can be obtained a circuit board. By adhering a metal foil such as copper foil already cut in a circuit pattern to the base material with the composition there can also be obtained a circuit board.

The electrically conductive circuit board can be prepared, for example, by printing a composition comprising the aromatic polyamide-imide, the polar organic solvent and the electrically conductive granular material on the insulative substrate in a circuit pattern and removing the polar organic solvent from the composition containing the conductive granular material by heating, or by laminating a film obtained by removing the polar organic solvent from the composition containing the conductive granular material on the insulative substrate in a circuit pattern.

The electrically resistant circuit board can be prepared, for example, by printing a composition comprising the aromatic polyamide-imide, the organic polar solvent and the electrically resistant granular material on the insulative substrate in a circuit pattern and removing the organic polar solvent from the composition by heating, or by laminating a film obtained by removing the polar organic solvent from the composition on the insulative substrate in a circuit pattern.

The multi-layer circuit board can be prepared, for example, by coating or printing a composition comprising the aromatic polyamide-imide and the polar organic solvent or the composition additionally comprising the insulative granular material over the entire surface of the electrically conductive circuit or the electrically resistant circuit or on the areas thereof to be multi-layered or pattern-wise on the electrically conductive circuit or the electrically resistant circuit in the case of through-hole connections and removing the polar organic solvent from the composition by heating, or by laminating a film obtained by removing the polar organic solvent from the composition over the entire surface of the electrically conductive circuit or electrically resistant circuit or pattern-wise on selected areas thereof to be laminated and further forming an electrically conductive circuit or an electrically resistant circuit thereon in the same manner as in preparing an electrically conductive circuit board or an electrically resistant board.

The hybrid circuit board can be prepared by forming an electrically conductive circuit and an electrically resistant circuit on an insulative substrate in the same manner as in preparing the multi-layer circuit board.

The circuit board having a protective layer thereon can be prepared by coating or printing a composition comprising the aromatic polyamide-imide and the polar organic solvent or the composition additionally comprising the insulative granular material on at least part of the surface of the electrically conductive circuit board, the electrically resistant circuit board, the multi-layer circuit board or the hybrid circuit board and removing the polar organic solvent from the composition by heating, or by laminating a film obtained by removing the polar organic solvent from the composition over the entire surface of the aforementioned circuit board or pattern-wise on the surface of the above described circuit board.

The mounting circuit boad can be prepared by bonding electrical elements to the circuit of the circuit board with a composition comprising the aromatic polyamide-imide, the polar organic solvent and the electrically conductive granular material by a method such as die bonding, or by bonding the electrical elements to the insulative substrate with a composition comprising the aromatic polyamide-imide, the polar organic solvent and the insulative granular material and then bonding the electrical elements to a circuit on the insulative substrate by a method such as wire bonding.

The condenser can be prepared by coating or printing a composition comprising the aromatic polyamide-imide, the polar organic solvent and the dielectric granular material uniformly dispersed therein on an electrode such as a metal and the providing another electrode thereon and removing the polar organic solvent from the composition by heating, or by laminating a film obtained by removing the polar organic solvent from the composition on an electrode and then providing another electrode thereon, or by evaporating or spattering a metal on both surfaces of a film obtained by removing the polar organic solvent from the composition, or by coating or printing a composition comprising the aromatic polyamide-imide, the polar organic solvent and the electrically conductive granular material uniformal dispersed therein on both surfaces of the film and removing the polar organic solvent from the composition by heating.

The electrical element having a lead wire can be prepared by bonding the electrical elements such as integrated circuits, passive elements, active elements and conversion elements to a lead wire such as a metal frame with a composition comprising the aromatic polyamide-imide, the polar organic solvent and the electrically conductive granular material and removing the polar organic solvent from the composition by heating.

The encapsulated electrical elements can be prepared by immersing integrated circuits, passive elements, active elements and conversion elements in a composition comprising the aromatic polyamide-imide and the polar organic solvent or the composition additionally comprising the insulative granular material uniformly dispersed therein and removing the polar organic solvent from the composition by heating.

The compositions as described have excellent thermal resistance, humidity resistance, adhesion, storage stability and electrical characteristics, and also the various substrates, circuit boards and electrical elements obtained by using the compositions have excellent thermal resistance, humidity resistance and high accuracy and reliability. Especially thermal resistance and humidity resistance are important to electronic parts from the standpoint of reliability.

The following Examples are given to illustrate the present invention more specifically. All parts in these Examples are by weight.

Electrical resistances in these Examples are measured by "Universal Digital Meter 2502" (tradename, manufactured by Yokogawa Electric Works Ltd.).

EXAMPLE 1 & COMPARATIVE EXAMPLE 1

Each of various base materials as set forth in Table 1 was impregnated with a composition of 100 parts of an aromatic polyamide-imide as set forth in Table 1, 600 parts of N-methyl-2-pyrrolidone and 400 parts of N,N-dimethylacetamide, and then subjected to heat treatment firstly at 100° C. for 3 hours and secondly at 150° C. for 2 hours. Ten sheets of the resulting impregnated base material were superimposed and press-molded at 200° C. and 100 Kg/cm² for 30 minutes to form a thermally resistant substrate having a size of 30 cm × 30 cm × 1.6 mm. The substrate thus obtained was subjected to a thermal resistance test at 400° C. for 30 minutes. The substrate had excellent thermal resistance and dimensional stability with very small reduction in weight as set forth in Table 1 and was obtained without warping. Further, the substrate withstood die-bonding at 400° C. Reduction in weight was calculated from the following equation, $$\text{Reduction in Weight (\%)} = \frac{\text{Weight of Substrate before Thermal Resistance Test} - \text{Weight of Substrate after Thermal Resistance Test}}{\text{Weight of Substrate before Thermal Resistance Test}} \times 100$$

TABLE 1

| Run No. | Base Material | Aromatic Polyamide-imide (Repeating Units) | (Reduced Viscosity) | Reduction in Weight (%) |
|---|---|---|---|---|
| 1 | Glass cloth* | 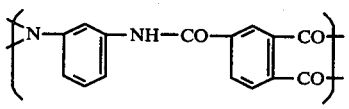 | (1.0) | 1.3 |
| 2 | Glass cloth* | 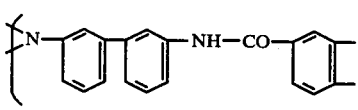 | (0.3) | 3.9 |
| 3 | Carbon fiber (Diameter: 20μ 20 g) | 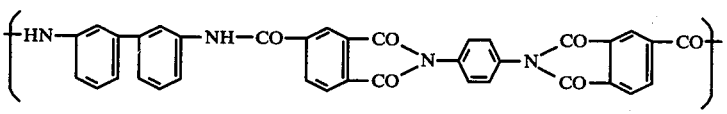 | (1.0) | 2.5 |
| 4 | Craft paper (Thickness: 0.18 mm) | 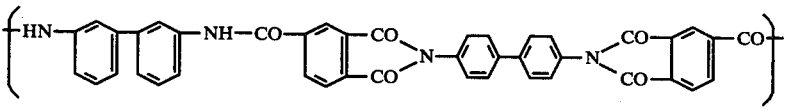 | (0.4) | 3.0 |
| 5 | Glass fiber (Diameter: 10μ 30 g) | 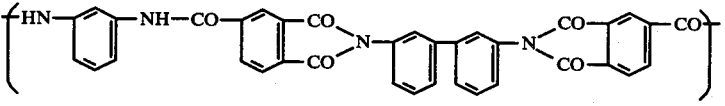 | (0.8) | 2.3 |

TABLE 1-continued

Aromatic Polyamide-imide

| Run No. | Base Material | (Repeating Units) | (Reduced Viscosity) | Reduction in Weight (%) |
|---|---|---|---|---|
| 6 | Glass cloth* | [structure] | (1.0) | 2.1 |
| 7 | Glass cloth* | [structure] | (0.6) | 2.1 |
| 8 | Glass cloth* | [structure] | (0.8) | 2.7 |
| 9 | Glass cloth* | [structure] | (1.2) | 1.7 |
| 10 | Glass cloth* | [structure] | (1.0) | 1.9 |
| Comparative Example | | | | |
| 1 | Glass cloth* | [structure] | (0.5) | 13.0 |

*Manufactured by Asahi-Schwebel Co., Ltd.: Trade name "7628-AS309"

EXAMPLE 2

On each of various base materials was coated a composition of 100 parts of an aromatic polyamide-imide as set forth in Table 2, 600 parts of N-methyl-2-pyrrolidone and 400 parts of N,N-dimethylacetamide and dried in vacuum at 100° C. for 3 hours to form an aromatic polyamide-imide laminate whose surface was smooth. When the aromatic polyamide-imide surface of the laminate was contacted with melted solder at 260° C. for 20 seconds or immersed in a 1% potassium hydroxide aqueous solution for 24 hours, no change such as swelling was observed and the thermal resistance, the adhesion and the alkali resistance of the aromatic polyamide-imide coating were good. Furthr, the surface resistance of the aromatic polyamide-imide side of the laminate after treatment at 50° C. and a relative humidity of 90% for 3 days was measured in accordance with the procedure of JIS C6481-1968.

The results are shown in Table 2.

TABLE 2

| Run No. | Base Material | Aromatic Polyamide-imide (Repeating Units) (Reduced Viscosity) | Thickness of Coating ($\mu$) | Surface Resistance ($\Omega$) |
|---|---|---|---|---|
| 1 | Polyethylene terephthalate film | [structure] | (20) | $3.0 \times 10^{16}$ |

TABLE 2-continued

Aromatic Polyamide-imide (Repeating Units)

| Run No. | Base Material | (Reduced Viscosity) | Thickness of Coating ($\mu$) | Surface Resistance ($\Omega$) |
|---|---|---|---|---|
| | | (1.3) | | |
| 2 | Paper-phenol resin laminate | [structure] (1.0) | (5) | $5.1 \times 10^{16}$ |
| 3 | Glass-epoxy laminate | [structure] (0.6) | (10) | $6.0 \times 10^{16}$ |
| 4 | Copper plate | [structure] (0.7) | (20) | $5.3 \times 10^{16}$ |
| 5 | Polyethylene terephthalate film | [structure] (0.8) | (5) | $4.4 \times 10^{16}$ |
| 6 | Alumina-ceramic plate | [structure] (0.4) | (10) | $7.0 \times 10^{16}$ |
| 7 | Polyethylene terephthalate film | [structure] (0.6) | (70) | $5.0 \times 10^{16}$ |
| 8 | Polyethylene terephthalate film | [structure] (0.3) | (20) | $8.5 \times 10^{16}$ |
| 9 | Polyethylene terephthalate film | [structure] (1.0) | (30) | $4.5 \times 10^{16}$ |
| 10 | Polyethylene terephthalate film | [structure] (0.7) | (20) | $4.8 \times 10^{16}$ |

EXAMPLE 3 & COMPARATIVE EXAMPLE 2

A polyimide film having a thickness of 75μ (trademark "Kapton", made by E. I. du Pont de Nemours and Company) was adhered to an electrolytic copper foil having a thickness of 35μ whose size was the same as the polyimide film in Run Nos. 1 to 5 and in Comparative Example 2 and which was punched in a circuit pattern in Run Nos. 6 to 10 using a solid or a semi-solid composition of an aromatic polyamide-imide and a polar organic solvent as set forth in Table 3 by heat pressing firstly at 150° C. for 30 minutes and secondly at 200° C. for 30 minutes. Then the article was subjected to thermal resistance test at 400° C. for 30 minutes. The copper foil peeling strength after the thermal resistance test is shown in Table 3. The article thus obtained had excellent thermal resistance and adhesion strength. The peeling strength was measured in accordance with the procedure of JIS C6481-1968. Also the inflammability resistance was measured in accordance with the procedure of JIS C6481-1968, and the results were excellent.

TABLE 3

| Run No. | Aromatic Polyamide-imide (Repeating Units) (Reduced Viscosity) / (parts) | Polar Organic Solvent (parts) | Thickness of Coating (μ) | Peeling Strength (Kg/cm) |
|---|---|---|---|---|
| 1 | (0.8) / (100) | N-Methyl-2-pyrrolidone (100) | 10 | 1.8 |
| 2 | (1.0) / (100) | N-Methyl-2-pyrrolidone (50) | 3 | 1.2 |
| 3 | (0.3) / (100) | Dimethyl sulfoxide (100) | 20 | 0.7 |
| 4 | (0.4) / (100) | N,N-Dimethylformamide (10) Hexamethylphosphoramide (10) | 20 | 1.0 |
| 5 | (0.6) / (100) | N,N-Dimethylacetamide (100) | 70 | 1.0 |
| 6 | (0.8) / (100) | N-Methyl-2-pyrrolidone (50) | 30 | 1.5 |
| 7 | (0.6) / (100) | N-Methyl-2-pyrrolidine (200) | 10 | 1.2 |

TABLE 3-continued

| Run No. | Aromatic Polyamide-imide (Repeating Units) (Reduced Viscosity) | (parts) | Polar Organic Solvent (parts) | Thickness of Coating (μ) | Peeling Strength (Kg/cm) |
|---|---|---|---|---|---|
| 8 | [structure] (0.8) | (100) | N—Methyl-2-pyrrolidone (100) | 5 | 1.3 |
| 9 | [structure] (0.6) | (100) | Hexamethylphosphoramide (100) N,N—Dimethylacetamide (100) | 10 | 1.3 |
| 10 | [structure] (1.0) | (100) | Hexamethylphosphoramide (100) N,N—Dimethylacetamide (100) | 20 | 1.5 |
| Comparative Example 2 | [structure] (0.1) | (100) | Hexamethylphosphoramide (100) N,N—dimethylacetamide (100) | 10 | 0.2 |

EXAMPLE 4 & COMPARATIVE EXAMPLE 3

A copper plate was bonded to a copper wire having a diameter of 1 mm using a compositions of an aromatic polyamide-imide and a polar organic solvent as set forth in Table 4 at 150° C. for one hour. Then the article thus bonded was subjected to a thermal resistance test at 400° C. for 30 minutes. The adhesion strength after the thermal resistance test is shown in Table 4.

As the adhesion strength the tensile adhesion strength was measured by stretching the copper wire vertically to the copper plate at a head speed of 0.5 cm/minute using a stretching tester.

TABLE 4

| Run No. | Aromatic Polyamide-imide (Repeating Units) (Reduced Viscosity) | (parts) | Polar Organic Solvent (parts) | Adhesion Strength (Kg) |
|---|---|---|---|---|
| 1 | [structure] (1.2) | (100) | N—Methyl-2-pyrrolidone (600) | 4.1 |
| 2 | [structure] (0.6) | (100) | N,N—Dimethylformamide (600) Hexamethylphosphoramide (100) | 3.3 |

TABLE 4-continued

| Run No. | Aromatic Polyamide-imide (Repeating Units) (Reduced Viscosity) | (parts) | Polar Organic Solvent (parts) | Adhesion Strength (Kg) |
|---|---|---|---|---|
| 3 | [structure with biphenyl-diamine linked via NH-CO to phthalimide-phenylene-phthalimide] (0.8) | (100) | Hexamethyl-phosphoramide (2,000) | 3.1 |
| 4 | [structure with biphenyl-diamine linked via NH-CO to phthalimide-biphenyl-phthalimide] (0.3) | (100) | Dimethyl sulfoxide (700) | 1.2 |
| 5 | [structure with phenylenediamine linked via NH-CO to phthalimide-biphenyl(3,3')-phthalimide] (0.4) | (100) | N—Methyl-2-pyrrolidone (1,000) | 2.6 |
| 6 | [structure with biphenyldiamine linked via NH-CO to phthalimide-biphenyl(3,3')-phthalimide] (0.5) | (100) | N,N—Dimethyl-acetamide (5,000) | 2.1 |
| 7 | [structure with p-phenylenediamine linked via NH-CO to phthalimide-biphenyl(3,3')-phthalimide] (1.0) | (100) | N—Methyl-2-pyrrolidone (900) N,N—Dimethyl-acetamide (200) | 3.5 |
| 8 | [structure with 4,4'-biphenyldiamine linked via NH-CO to phthalimide-biphenyl(3,3')-phthalimide] (0.5) | (100) | Hexamethyl-phosphoramide (100) N,N—Dimethyl-acetamide (500) | 3.0 |
| 9 | [structure with biphenyldiamine linked via NH-CO to phthalimide-phenylene(m)-phthalimide] (0.4) | (100) | N—Methyl-2-pyrrolidone (400) | 2.8 |
| 10 | [structure with p-phenylenediamine linked via NH-CO to phthalimide-phenylene(m)-phthalimide] (0.8) | (100) | N—Methyl-2-pyrrolidone (400) | 3.3 |

Comparative Example

| | | | | |
|---|---|---|---|---|
| 3 | [structure N-phenylene-NH-CO-phthalimide] (0.1) | (100) | N—Methyl-2-pyrrolidone (600) N,N—Dimethyl-acetamide (400) | 0.3 |

EXAMPLE 5

A solid or semi-solid composition was prepared from the aromatic polyamide-imide and a polar organic solvent as set forth in Table 5, then press-molded firstly at 150° C. for 30 minutes and secondly at 200° C. for 30 minutes at 100 Kg/cm² using a heat press and subjected to heat treatment at 200° C. for 2 hours to form a film having a thickness of 200μ.

The volume resistivity of the film thus obtained was measured in accordance with the procedure of JIS C6481-1968 and the permeability of water vapor was measured in accordance with the procedure of JIS Z0208. The results are shown in Table 5. The film had excellent electrical properties and humidity resistance.

TABLE 5

| Run No. | Aromatic Polyamide-imide (Repeating Units) (Reduced Viscosity) | (parts) | Polar Organic Solvent (parts) | Vapor Permeability (g/m²·24 hrs.) | Volume Resistivity (Ω·cm) |
|---|---|---|---|---|---|
| 1 | [structure] (1.0) | (100) | N—Methyl-2-pyrrolidone (100) | 4.3 | 1.6 × 10¹⁶ |
| 2 | [structure] (0.8) | (100) | N,N—Dimethyl-acetamide (200) | 6.1 | 3.8 × 10¹⁶ |
| 3 | [structure] (0.3) | (100) | Hexamethyl-phosphor-amide (30) | 9.1 | 4.9 × 10¹⁶ |
| 4 | [structure] (1.0) | (100) | N—Methyl-2-pyrrolidone (70) / N,N—Dimethyl-formamide (30) | 5.2 | 2.2 × 10¹⁶ |
| 5 | [structure] (0.5) | (100) | N,N—Dimethyl-acetamide (50) | 7.5 | 4.5 × 10¹⁶ |
| 6 | [structure] (0.4) | (100) | N,N—Dimethyl-acetamide (50) / Hexamethyl-phosphor-amide (20) | 7.2 | 4.1 × 10¹⁶ |
| 7 | [structure] (0.6) | (100) | N—Methyl-2-pyrrolidone (80) | 6.3 | 3.1 × 10¹⁶ |
| 8 | [structure] | (100) | N,N—Dimethyl-acetamide (40) | 11.4 | 6.4 × 10¹⁶ |

TABLE 5-continued

| Run No. | Aromatic Polyamide-imide (Repeating Units) (Reduced Viscosity) | (parts) | Polar Organic Solvent (parts) | Vapor Permeability (g/m² · 24 hrs.) | Volume Resistivity (Ω · cm) |
| --- | --- | --- | --- | --- | --- |
| 9 | (0.3) structure: ⫤N–⌬–NH–CO–⌬(CO/CO)⫣ (1.3) | (100) | N—Methyl-2-pyrrolidone (50) | 4.0 | 1.8 × 10¹⁶ |
| 10 | ⫤HN–⌬–⌬–NH–CO–⌬(CO/CO)N–⌬–N(CO/CO)–⌬–C⫣ (0.8) | (100) | N—Methyl-2-pyrrolidone (200) | 5.3 | 2.3 × 10¹⁶ |
| 11 | ⫤HN–⌬–⌬–NH–CO–⌬(CO/CO)N–⌬–N(CO/CO)–⌬–C⫣ (1.0) | (100) | N—Methyl-2-pyrrolidone (200) | 5.0 | 2.5 × 10¹⁶ |

EXAMPLE 6

To 240 parts of N-methyl-2-pyrrolidone and 160 parts of N,N-dimethylacetamide were added 100 parts of an aromatic polyamide-imide having a reduced viscosity of 0.5 synthesized from m-phenylenediamide and trimellitic anhydride monoacid chloride and dissolved therein. Then to the solution were added 400 parts of super-fine silver particles having an average diameter of 700 Å prepared by vacuum evaporation and uniformly dispersed therein by a ball mill to give a paste. In order to test its electrical conduction the paste was screen-printed on an alumina base plate to form 20 electrically conductive lines having a width of 1 mm, a length of 2 cm and a thickness of about 50μ and subjected to heat treatment at 100° C. for 30 minutes to sufficiently remove the solvents. The electrical resistance of one line of the pattern thus formed was 0.2 Ω or less and its adhesion to the base plate was good.

Further, in order to test the thermal resistance of the line, the resulting article was subjected to heat treatment at 400° C. for one hour. The electrical resistance of the line thus treated was 0.3 Ω or less and hardly any change was observed after the heat treatment, and the lines did not peel off from the base plate and their adhesion was excellent.

EXAMPLE 7

To 500 parts of N-methyl-2-pyrrolidone were added 100 parts by weight of an aromatic polyamide-imide having a reduced viscosity of 0.7 synthesized from 4,4'-di(m-aminophenoxy)diphenyl ether and trimellitic anhydride monoacid chloride and dissolved therein. Then to the solution were added 250 parts of a fine metal mixture of super-fine silver particles having an average diameter of 700 Å prepared by vacuum evaporation and palladium particles having an average diameter of 0.5μ at a 1:1 weight ratio and uniformly dispersed therein by a ball mill to give a paste. The paste thus obtained was treated in the same manner as in Example 6. The electrical resistance of the line thus prepared was 0.3 Ω or less and its adhesion was good. Further, the resulting article was subjected to the same heat treatment as in Example 6. The electrical resistance of the line was 0.4 Ω or less, and the lines did not peel off from the base plate and their adhesion was excellent.

EXAMPLE 8

To 400 parts of N,N-dimethylacetamide were added 100 parts of an aromatic polyamide-imide having a reduced viscosity of 0.4 synthesized from 3,3'-diaminodiphenyl and trimellitic anhydride monoacid chloride and dissolved therein. Then to the solution were added 400 parts of fine ruthenium oxide particles having an average diameter of 0.8μ and uniformly dispersed therein by a ball mill to give a paste. In order to test its electrical resistance the paste was screen-printed on an alumina base plate to form 20 electrically resistant lines having a width of 1 mm, a length of 2 cm and a thickness of about 50μ and subjected to heat treatment at 100° C. for 30 minutes to sufficiently remove the solvent. The electrical resistance of one line of the pattern thus formed was 20 KΩ and its adhesion to the base plate was good.

Further, in order to test the thermal resistance of the line, the resulting article was subjected to heat treatment at 400° C. for 30 minutes. The electrical resistance of the line thus treated was 20 KΩ and no change was observed after the heat treatment, and the lines did not peel off from the base plate and their adhesion was excellent.

EXAMPLE 9

A paste was prepared by uniformly dispersing 400 parts of fine copper particles having an average particle diameter of 10μ in a solution of 100 of an aromatic polyamide-imide having a reduced viscosity of 0.3 synthesized from 2,4-tolylenediamine and trimellitic anhydride monoacid chloride, 10 parts of an epoxy resin (trade name "AER-669," manufactured by Asahi Chemical Industry Co., Ltd.) and 500 parts of N-methyl-2-pyrrolidone. The paste was screen-printed pattern-wise on a glass-epoxy laminate and then subjected to heat treatment at 150° C. for 30 minutes to give a print circuit substrate. The electrical conductor thus obtained had a resistivity of $2.0 \times 10^{-4} \Omega \cdot cm$ and withstood soldering at 270° C. for 60 seconds and its adhesion was also good.

EXAMPLE 10

A paste was prepared by uniformly dispersing 350 parts of fine silver particles having an average particle diameter of $1.8\mu$ in a solution of 100 parts of an aromatic polyamide-imide having a reduced viscosity of 0.8 synthesized from a bisimidedicarboxylic acid having been prepared from 4,4'-diaminodibenzyl and trimellitic anhydride monoacid chloride and 3,3'-diisocyanate diphenyl, 240 parts of N-methyl-2-pyrrolidone and 160 parts of N,N-dimethylacetamide. The paste was screen-printed pattern-wise on a polyimide film and then subjected to heat treatment at 100° C. for 30 minutes to give a print circuit board. The electrical conductor thus obtained had a resistivity of $4.5 \times 10^{-4} \Omega \cdot cm$ and withstood thermal resistance test at 400° C. for 30 minutes and its adhesion was also good.

EXAMPLE 11

A paste was prepared by uniformly dispersing 200 parts of fine carbon particles having an average particle diameter of $10\mu$ and 200 parts of fine boron particles having an average particle diameter of $20\mu$ in a solution of 100 parts of an aromatic polyamide-imide having a reduced viscosity of 0.6 synthesized from a bisimidedicarboxylic acid having been prepared from p-phenylenediamine and trimellitic anhydride and 3,3'-diisocyanate diphenyl, 240 parts of N-methyl-2-pyrrolidone and 160 parts of N,N-dimethylacetamide. The paste was screen-printed on a glass plate to form lines having a width of 1 mm, a length of 2 cm and a thickness of about $50\mu$ and then subjected to heat treatment at 100° C. for 30 minutes to give an electrical resistance circuit. The resistor thus obtained had a resistance of 500 $\Omega$ and withstood thermal resistance test at 270° C. and its adhesion was also good.

EXAMPLE 12

A paste was prepared by uniformly dispersing 450 parts of fine indium oxide having an average particle diameter of $20\mu$ in a solution of 100 parts of an aromatic polyamide-imide having a reduced viscosity of 0.5 synthesized from a bisimidedicarboxylic acid having been prepared from 3,3'-diaminodiphenyl and trimellitic anhydride and 4,4'-diisocyanate diphenyl methane and 300 parts of N,N-dimethylacetamide. The paste was screen-printed on a polyimide film to form lines having a width of 1 mm, a length of 2 cm and a thickness of about $50\mu$ and then subjected to heat treatment at 100° C. for one hour to give an electrical resistance circuit. The resistor thus obtained had a resistance of 10 K$\Omega$ withstood thermal resistance test at 270° C. and its adhesion was also good.

EXAMPLE 13

100 parts of an aromatic polyamide-imide having a reduced viscosity of 1.5 synthesized from a bisimidedicarboxylic acid having been prepared from 3,3'-diaminodiphenyl and trimellitic anhydride and 2,4-toluylenediisocyanate were added with 240 parts of N-methyl-2-pyrrolidone and 160 parts of N,N-dimethylacetamide and dissolved therein. Then to the solution were added 300 parts of tantalum nitride having an average particle diameter of $20\mu$ and uniformly dispersed by a ball mill to give a paste. The paste thus obtained was treated in the same manner as in Example 6 and the resistance was 50 K$\Omega$ and the adhesion was good.

Further, in order to test its thermal resistance the resulting article was subjected to heat treatment at 400° C. for 30minutes. The resistance and the adhesion did not change.

EXAMPLE 14

100 parts of an aromatic polyamide-imide having a reduced viscosity of 0.5 synthesized from m-phenylenediamine and trimellitic anhydride monoacid chloride were added with 200 parts of N,N-dimethylacetamide and dissolved therein. Then to the solution were added 450 parts of tungsten carbide having an averge particle diameter of $20\mu$ and uniformly dispsersed therein by a ball mill to give a paste. The paste thus obtained was screen-printed in the same manner as in Example 6 and subjected to heat treatment at 100° C. for one hour. The resistance was 10 K$\Omega$ and the adhesion was good.

In order to test its thermal resistance the resulting article was subjected to heat treatment at 400° C. for 30 minutes. The resistance and the adhesion did not change.

EXAMPLE 15

100 parts of an aromatic polyamide-imide having a reduced viscosity of 0.8 synthesized from m-phenylenediamine and trimellitic anhydride monoacid chloride were added with 240 parts of N-methyl-2-pyrrolidone and 160 parts of N,N-dimethylacetamide and dissolved therein. Then to the solution were added 300 parts of fine particles having an average particle diameter of $20\mu$ prepared by heating 270 parts of tantalum silicide and 30 parts of aluminium at 1200° C. for one hour in a nitrogen atmosphere and uniformly dispersed by a ball mill to give a thermal resistance resistor paste. When the paste was treated in the same manner as in Example 6, the resistance was 10 K$\Omega$.

Then, in order to test its thermal resistance, the resulting article was subjected to heat treatment at 400° C. for 30 minutes. The resistance did not change after the heat treatment and the lines did not peel off from the base plate and their adhesion was excellent.

EXAMPLE 16

A paste was prepared by uniformly dispersing 400 parts of fine aluminium oxide particles having an average particle diameter of $0.8\mu$ in a solution of 100 parts of an aromatic polyamide-imide having a reduced viscosity of 1.0 synthesized from a bisimidedicarboxylic acid having been prepared from 4,4'-diaminodiphenyl ether and trimellitic anhydride and 3,3'-diisocyanate diphenyl, 2 parts of a silane coupling agent (trade name "A-1100," manufactured by Nippon Unicar Co., Ltd.), 10 parts of an epoxy resin (trade name "AER-669," manufactured by Asahi Chemical Industry Co., Ltd.) and 500 parts of N-methyl-2-pyrrolidone. The paste thus obtained was coated on the entire surface of an alumina base plate at a thickness of $5\mu$ and then subjected to heat treatment at 150° C. for 30 minutes to give an insulative substrate. The insulative substrate thus obtained withstood thermal resistance test at 400° C. and the adhesion was good.

EXAMPLE 17

A comporision was prepared by uniformly dispersing 400 parts of silicon dioxide having an average particle diameter of 10μ in a solution of 100 parts of an aromatic polyamide-imide having a reduced viscosity of 1.2 synthesized from m-phenylenediamine and trimellitic anhydride monoacid chloride and 500 parts of N,N-dimethylacetamide. The composition thus obtained was poured in a mold and then subjected to heat treatment firstly at 100° C. for one hour and secondly at 200° C. for one hour to give an insulative substrate having a size of 30 cm×30cm× 0.5 mm. The insulative substrate withstood thermal resistance test at 400° C. for 30 minutes, and no warping was observed and dimensional accuracy was good.

EXAMPLE 18

100 parts of an aromatic polyamide-imide having a reduced viscosity of 0.7 synthesized from a bisimidedicarboxylic acid prepared from 4,4'-diaminodiphenyl sulfone and trimellitic anhydride and 3,3'-diisocyanatodiphenyl were added with 5 parts of a silane coupling agent (trade name "A-1100", manufactured by Nippon Unicar Co., Ltd.) and 400 parts by weight of dimethyl sulfoxide and dissolved therein. Then to the solution were added 500 parts of fine gold particles having an average particle diameter of 5μ and uniformly dispersed by a ball mill to give a paste. The paste thus obtained was screen-printed in the same manner as in Example 6 and then subjected to heat treatment at 150° C. for 30 minutes. The resistance was 0.2 Ω or less and the adhesion was good.

When the thermal resistance was tested in the same manner as in Example 6, the resistance was 0.2 Ω or less, and the lines did not peel from the base plate and their adhesion was excellent.

EXAMPLE 19

100 parts of an aromatic polyamide-imide having a reduced viscosity of 0.5 synthesized from a bisimidedicarboxylic acid having been prepared from benzidine and trimellitic anhydride and 3,3'-diisocyanate diphenyl were added to 500 parts by weight of N,N-dimethylformamide and dissolved therein. Then to the solution were added 500 parts of fine nickel particles having an average particle diameter of 3μ and uniformly dispersed by a ball mill to give a paste. The paste was thus obtained was screen-printed in the same manner as in Example 6 and then subjected to heat treatment at 100° C. for 30 minutes. The resistance was 0.3 Ω or less and the adhesion was good.

When the thermal resistance was tested in the same manner as in Example 6, the resistance was 0.4 Ω or less, and the lines did not peel from the base plate and their adhesion was excellent.

EXAMPLE 20

100 parts of an aromatic polyamide-imide having a reduced viscosity of 1.0 synthesized from 3,3'-diaminodiphenyl methane and trimellitic anhydride monoacid chloride were added to 400 parts of hexamethylphosphoramide and dissolved therein. Then to the solution were added 400 parts of fine tin particles having an average particle diameter of 5μ and uniformly dispersed by a ball mill to give a paste. The paste thus obtained was screen-printed in the same manner as in Example 6 and subjected to heat treatment at 150° C. for 30 minutes. The resistance was 0.3 Ω or less and the adhesion was good.

When the thermal resistance was tested in the same manner as in Example 6, the resistance was 0.3 Ω or less, and the lines did not peel from the base plate and their adhesion was excellent.

EXAMPLE 21

100 parts of an aromatic polyamide-imide having a reduced viscosity of 0.4 synthesized from a bisimidedicarboxylic acid prepared from 3,3'-diaminodiphenyl and trimellitic anhydride and 3,3'-diisocyanatodiphenyl were added to 400 parts by weight of N,N-dimethylacetamide and dissolved therein. Then to the solution were added 500 parts of fine $SnO_2$ particles having an average particle diameter of 10μ and uniformly dispersed therein by a ball mill to give a paste. The paste thus obtained was screen-printed in the same manner as in Example 6 and then subjected to heat treatment at 100° C. for 30 minutes. The resistance was 10 KΩ. The resulting article withstood thermal resistance test at 400° C. for 30 minutes and the adhesion was good.

EXAMPLE 22

100 parts of an aromatic polyamide-imide having a reduced viscosity as set forth in Table 6 synthesized from m-phenylenediamine and trimellitic anhydride monoacid chloride were added to 400 parts of N-methyl-2-pyrrolidone and dissolved therein. Then to the solution were added 400 parts of fine particles having an average particle diameter of 5μ as set forth in Table 6 and uniformly dispersed therein by a ball mill to give a paste. The paste thus obtained was screen-printed in the same manner as in Example 6 and then subjected to heat treatment at 150° C. for 30 minutes. The resistance, the heat resistance test at 400° C. for 30 minutes and the adhesion are set forth in Table 6.

TABLE 6

| Run No. | Reduced Viscosity of Polyamide-imide | Fine Particles | Resistance | Thermal Resistance Test | Adhesion |
| --- | --- | --- | --- | --- | --- |
| 1 | 1.5 | $Tl_2O_3$ | 20 KΩ | No change | Good |
| 2 | 0.8 | C | 300 Ω | " | " |
| 3 | 0.5 | TiN | 40 KΩ | " | " |
| 4 | 0.7 | MoSi | 15 KΩ | " | " |

EXAMPLE 23

100 parts of an aromatic polyamide-imide having a reduced viscosity as set forth in Table 7 synthesized from m-phenylenediamine and trimellitic anhydride monoacid chloride were added at 400 parts N,N-dimethylacetamide and dissolved therein. Then to the solution were added 400 parts of fine particles having an average particle diameter of 10μ as set forth in Table 7 and uniformly dispersed by a ball mill to give a paste. The paste thus obtained was treated in the same manner as in Example 17. The thermal resistance test at 400° C. for 30 minutes and the dimensional accuracy are set forth in Table 7.

TABLE 7

| Run No. | Reduced Viscosity of Polyamide-imide | Fine Particle | Thermal Resistance Test | Dimensional Accuracy |
|---|---|---|---|---|
| 1 | 0.5 | $TiO_2$ | No change | Good |
| 2 | 0.4 | BeO | " | " |
| 3 | 1.0 | $Si_3N_4$ | " | " |
| 4 | 0.8 | $BaTiO_3$ | " | " |

EXAMPLE 24

Various pastes were prepared in the same manner as in Example 6 except that 100 parts of an aromatic polyamide-imide synthesized from an aromatic diamine as set forth in Table 8 and trimellitic anhydride monoacid chloride and granular materials for giving electrical characteristics as set forth in Table 8 were used. The results of evaluation of these pastes in the same manner as in Example 6 are set forth in Table 8, and the lines thus formed had excellent thermal resistance and adhesion.

TABLE 8

| Run No. | Aromatic Diamine | Reduced Viscosity of Polyamide-imide | Granular Material for Imparting Electrical Characteristics [Average Particle Diameter & Amount used (parts)] | Resistance | Thermal Resistance Test | Adhesion |
|---|---|---|---|---|---|---|
| 1 | 3,3'-Diaminodiphenyl sulfide | 0.3 | Pt (10μ)—Ag (2μ) 200    300 | 0.5 Ω | No change | Good |
| 2 | 3,3'-Diaminodiphenyl sulfone | 1.2 | Ag (2μ)—PdO (5μ) 100    400 | 5 KΩ | " | " |
| 3 | 3,3'-Diaminobenzo-phenone | 0.8 | Ag (2μ)—$NiO_2$ (5μ) 200    300 | 1 KΩ | " | " |
| 4 | 3,3'-Diaminodibenzyl | 0.5 | $Cu_2O$ (10μ)—CuO (10μ) 250    250 | 30 KΩ | " | " |

EXAMPLE 25

Various pastes were prepared in the same manner as in Example 17 except that 100 parts of an aromatic polyamide-imide synthesized from a bisimidedicarboxylic acid obtained from an aromatic diamine as set forth in Table 9 and trimellitic anhydride and 3,3'-diisocyanate diphenyl and 400 parts by weight of granular materials for imparting electrical characteristics having an average particle diameter of 10μ as set forth in Table 9 were used. The results of evaluation of these paste in the same manner as in Example 17 are set forth in Table 9 and the insulative substrates thus obtained had excellent thermal resistance and adhesion.

TABLE 9

| Run No. | Aromatic Diamine | Reduced Viscosity of Polyamide-imide | Granular Material for Imparting Electrical Characteristics | Thermal Resistance Test | Dimensional Accuracy |
|---|---|---|---|---|---|
| 1 | 2,5-Tolylenediamine | 1.5 | SiO—Si (1:1 weight ratio) | No change | Good |
| 2 | 4,4'-Diaminodiphenyl sulfide | 0.6 | SiC—$SiO_2$ (1:1 weight ratio) | " | " |
| 3 | 4,4'-Diaminobenzo-phenone | 0.4 | $Ta_2O_3$ | " | " |
| 4 | 4,4'-Diaminodiphenyl-methane | 1.0 | BN | " | " |

EXAMPLE 26

Various pastes were obtained in the same manner as in Example 6 except that 100 parts of an aromatic polyamide-imide synthesized from a bisimidedicarboxylic acid prepared from 3,3'-diaminodiphenyl and trimellitic anhydride and an aromatic diisocyanate as set forth in Table 10 and granular materials for giving electrical characteristics as set forth in Table 10 were used. The results of evaluation of these pastes in the same manner as in Example 6 are set forth in Table 10, and the lines had excellent thermal resistance and adhesion.

TABLE 10

| Run No. | Aromatic Diisocyanate | Reduced Viscosity of Polyamide-imide | Granular Material for Imparting Electrical Characteristics [Average Particle Diameter (μ) & Amount Used (parts)] | Resistance | Thermal Resistance Test | Adhesion |
|---|---|---|---|---|---|---|
| 1 | 3,3'-Diisocyanate diphenylether | 0.4 | Ag (2μ)—PdO (5μ)—Pd (5μ) 50    400    50 | 8 KΩ | No change | Good |
| 2 | 3,3'-Diisocyanate diphenyl sulfide | 0.6 | C (10μ)—B (10μ)—Ag (2μ) 200    250    50 | 300 KΩ | " | " |
| 3 | 3,3'-Diisocyanate diphenyl sulfone | 1.2 | Ag (2μ)—PdO (5μ)—$Sb_2O_3$ (10μ) 50    300    150 | 10 KΩ | " | " |
| 4 | 3,3'-Diisocyanate benzophenone | 0.3 | $In_2O_3$ (10μ)—$Sb_{23}$ (10μ) 400    100 | 20 KΩ | " | " |

TABLE 10-continued

| Run No. | Aromatic Diisocyanate | Reduced Viscosity of Polyamide-imide | Granular Material for Imparting Electrical Characteristics [Average Particle Diameter (μ) & Amount Used (parts)] | Resistance | Thermal Resistance Test | Adhesion |
|---|---|---|---|---|---|---|
| 5 | 4,4'-Diisocyanate dibenzyl | 0.8 | SnO₂ (10μ)—Sb₂O₃ (10μ)<br>400       100 | 15 KΩ | " | " |
| 6 | 3,3'-Diisocyanate dibenzyl | 0.5 | TiN (10μ)—Ti (5μ)<br>400       100 | 20 KΩ | " | " |
| 7 | 4,4'-Di(m-isocyanate-phenoxy)diphenyl ether | 0.5 | TaN (10μ)—Ta (5μ)<br>400       100 | 30 KΩ | " | " |
| 8 | 4,4'-Di(m-isocyanate-phenoxy)diphenyl ether | 0.5 | SnO₂ (10μ)—Ta₂O₅ (10μ)<br>400       100 | 15 KΩ | " | " |
| 9 | 4,4'-Di(m-isocyanate-phenoxy)diphenyl ether | 0.5 | MoO₃ (10μ)—B (10μ)<br>200       300 | 25 KΩ | " | " |
| 10 | 4,4'-Di(m-isocyanate-phenoxy)diphenyl ether | 0.5 | ZnO (5μ)<br>500 | 5 KΩ | " | " |
| 11 | 4,4'-Di(m-isocyanate-phenoxy)diphenyl ether | 0.5 | CdO (10μ)—ZnO (5μ)<br>250       250 | 10 KΩ | " | " |
| 12 | 4,4'-Diisocyanate diphenyl ether | 1.0 | WC (10μ)—W (5μ)<br>200       100 | 50 KΩ | " | " |
| 13 | 4,4'-Diisocyanate diphenyl sulfide | 0.8 | CoSi (10μ)<br>500 | 20 KΩ | " | " |
| 14 | 4,4'-Diisocyanate diphenyl sulfone | 0.7 | MnSi (10μ)—ZrSi (10μ)<br>150       150 | 100 KΩ | " | " |
| 15 | 4,4'-Diisocyanate benzophenone | 0.5 | NiSi (10μ)—TiSi (10μ)<br>250       250 | 15 KΩ | " | " |

EXAMPLE 27

On a circuit board having a circuit of the first layer obtained by etching a copper-clad laminate where the thickness of the copper layer was 35μ was screen-printed a composition of 100 parts of an aromatic polyamide-imide having a reduced viscosity of 1.0 and repeating units of the formula,

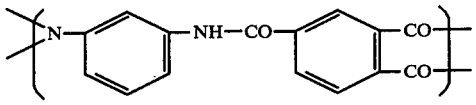

600 parts of N-methyl-2-pyrrolidone and 400 parts of N,N-dimethylacetamide at a dry thickness of 50μ and then subjected to heat treatment at 150° C. for one hour to form an insulative layer for crossover. On the insulative layer was screen-printed a composition of 100 parts of an aromatic polyamide-imide having a reduced viscosity of 0.5 and the same repeating units as described above, 300 parts of N-methyl-2-pyrrolidone, 200 parts of N,N-dimethylacetamide and 500 parts of fine silver particles having an average particle diameter of 1.8μ at a dry thickness of 30μ and then subjected to heat treatment at 150° C. for 30 minutes to form an electrically conductive circuit of the second layer whose resistivity was $1.6 \times 10^{-4}$ Ω·cm. The insulative resistance of the insulative layer measured by impressing a voltage of 100 V to the circuits of the first and second layers was $2 \times 10^6$ MΩ.

On the resulting circuit board having two layers of circuits was screen-printed a composition consisting of 100 parts of an aromatic polyamide-imide having a reduced viscosity of 1.0 and the same repeating units as described above, 600 parts of N-methyl-2-pyrrolidone and 400 parts of N,N-dimethylacetamide at a dry thickness of 100μ and then subjected to heat treatment at 150° C. for one hour to form a protective layer. The multi-layer circuit board thus obtained after the stability test at 70° C. at a relative humidity of 90% for 1,000 hours showed excellent stability without any change in the resistivity of the electrically conductive layer and the insulative resistance of the insulative layer.

EXAMPLE 28

On a glass-epoxy laminate was screen-printed a composition of 100 parts of an aromatic polyamide-imide having a reduced viscosity of 0.6 and repeating units of the formula,

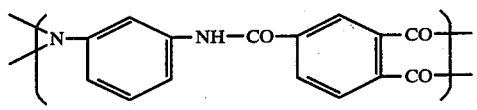

300 parts of N-methyl-2-pyrrolidone, 200 parts of N,N-dimethylacetamide and 500 parts of fine silver particles having an average particle diameter of 1.8μ at a dry thickness of 40μ, and subjected to heat treatment at 150° C. for 30 minutes to form an electrically conductive circuit whose resistivity was $1.5 \times 10^{-4}$ Ω·cm. Then on the electrically conductive circuit thus obtained was screen-printed a composition of 100 parts of an aromatic polyamide-imide having a reduced viscosity of 0.8 and the same repeating units as described above, 400 parts of N-methyl-2-pyrrolidone and 400 parts of fine particles of carbon having an average diameter of 5μ at a dry thickness of 40μ and a size of 1 mm (width)×2 cm (length) and subjected to heat treatment at 150° C. for 2 hours to form a resistant circuit whose resistance was 400Ω. Further, on the resulting hybrid circuit board was screen-printed a composition of 100 parts of an aromatic polyamide-imide having a reduced viscosity of 1.0 and the same repeating units as described above, 600 parts of N-methy-2-pyrrolidone and 400 parts of N,N-dimethylacetamide at a dry thickness of 100μ to form a protective layer. The hybrid circuit board thus obtained after the stability test at 70° C. at a relative humidity of 90% for 1,000 hours showed excellent stability without any change in the resistivity of the conductive circuit and the resistance of the resistant circuit.

EXAMPLE 29

A GaPAs light emission diode was bonded to a lead wire of a metal frame with a composition of 100 parts of an aromatic polyamide-imide having a reduced viscosity of 0.4 and repeating units of the formula,

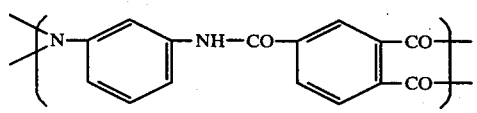

25 parts of an epoxy resin (trademark "AER-331," made by Asahi Chemical Industry Co., Ltd.), 400 parts of N-methyl-2-pyrrolidone and 500 parts of fine silver particles having an average diameter of 1.8μ by heat treatment at 150° C. for 30 minutes. The article thus bonded withstood the wire bonding at 350° C. for 2 minutes.

EXAMPLE 30

A silicon-tantalum resistor was immersed in a composition of parts of an aromatic polyamide-imide having a reduced viscosity of 1.0 and repeating units of the formula,

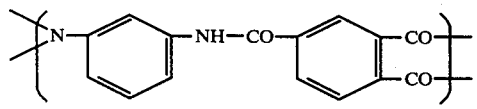

600 parts of N-methyl-2-pyrrolidone and 400 parts of N,N-dimethylacetamide and then subjected to heat treatment at 150° C. for 30 minutes. The rate of change in resistance of the resistor thus obtained after the stability test at 70° C. and a relative humidity of 90% for 1,000 hours was at most 0.1%, and thus the resistor showed excellent stability.

EXAMPLE 31

A composition of 100 parts of an aromatic polyamide-imide having a reduced viscosity of 1.0, 1,200 parts of N-methyl-2-pyrrolidone and 800 parts of N,N-dimethylacetamide was subjected to heat treatment firstly at 150° C. for one hour and secondly at 200° C. for one hour to form a film having a thickness of 10μ. On both surfaces of the film silver was spattered to a thickness of 1μ at a size of 1 cm×1 cm to prepare electrodes. The condenser thus prepared had a capacity of $4 \times 10^{-4}$ μF and withstood the thermal resistance test at 400° C. for 30 minutes.

EXAMPLE 32

A composition of 100 parts of an aromatic polyamide-imide having a reduced viscosity of 0.5 and repeating units of the formula,

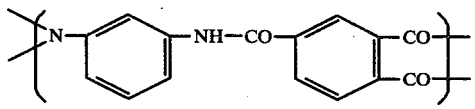

300 parts of N-methyl-2-pyrrolidone, 200 parts of N,N-dimethylacetamide and 500 parts of fine silver particles having an average particle diameter of 1.8μ was adhered to a silicon chip. The chip thus obtained was bonded to an alumina ceramic board with the same composition as described above, and then subjected to heat treatment at 150° C. for one hour. When the resulting article was placed on a hot plate at 400° C. and jerked by a pull gauge at a force of 50 g, the article did not peel off and had excellent thermal resistance and adhesion.

EXAMPLE 33

An alumina ceramic circuit board obtained by firing a Ag-Pd paste for preparing thick films by firing at high temperatures was bonded to a light emission diode with a composition of 100 parts of an aromatic polyamide-imide having a reduced viscosity of 0.6 and repeating units for the formula,

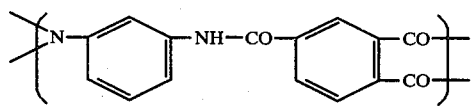

300 parts of N-methyl-2-pyrrolidone, 200 parts of N,N-dimethylacetamide and 500 parts of fine silver particles having an average particle diameter of 1.8μ by heat treatment at 150° C. for one hour. The article thus bonded withstood the wire bonding at 350° C. for 2 minutes.

While the invention has been described in detail and with reference to specific embodiments thereof, it will be apparent to one skilled in the art that various changes and modifications can be made therein without departing from the spirit and scope thereof.

What is claimed is:

1. An article for electrical use, comprising (a) an aromatic polyamide-imide having a reduced viscosity of from about 0.3 to 1.5 and repeating units for the formula,

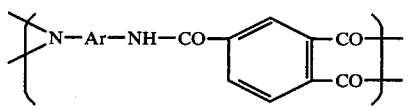

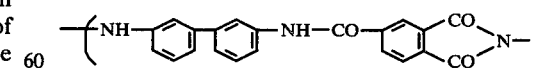

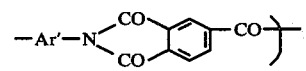

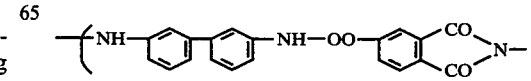

-continued

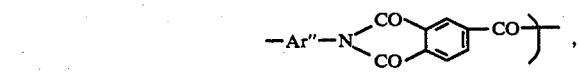

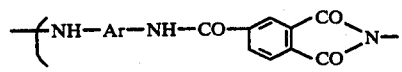

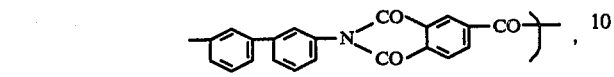

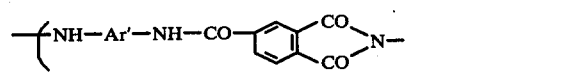

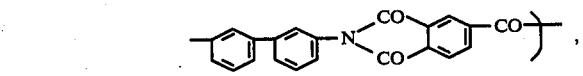

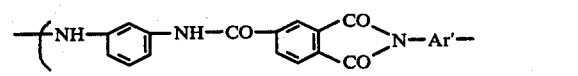

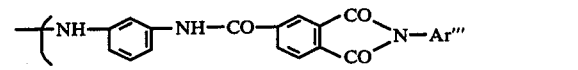

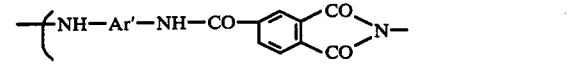

or

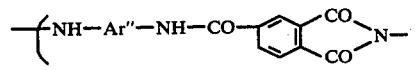

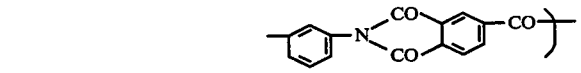

wherein Ar is a divalent residue represented by the formula,

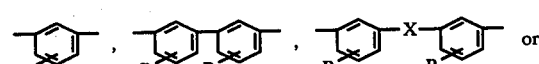

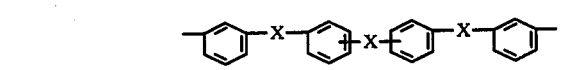

Ar' is a divalent residue represented by the formula,

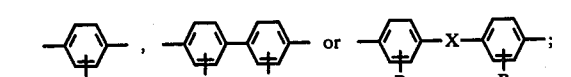

Ar'' is a divalent residue represented by the formula,

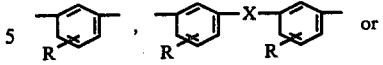

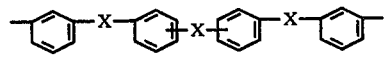

and Ar''' is a divalent residue represented by the formula,

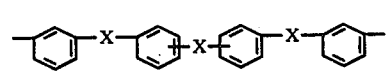

wherein R moieties may be the same or different and represent a hydrogen atom, a halogen atom or an alkyl group having 1 to 4 carbon atoms; X is an oxygen atom, a sulfur atom, a sulfonyl group, a carbonyl group, a carbonyloxy group, a methylene group, an ethylene group or a dimethylmethylene group; and (b) about 1 to 40 times the weight of (a) of at least one granular material uniformly dispersed therein selected from the group consisting of metals, metal oxides, metal nitrides, metal carbides, metal silicides, silicon, silicon oxides, silicon nitrides, silicon carbide, boron, boron nitrides and carbon.

2. The article of claim 1, wherein Ar in the formula of the aromatic polyamide-imide is

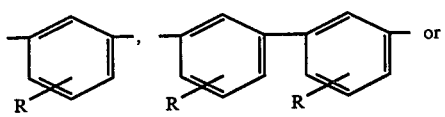

Ar' is 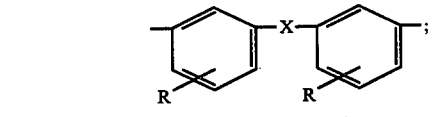

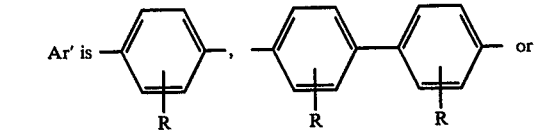

Ar'' is 

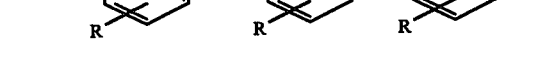

-continued

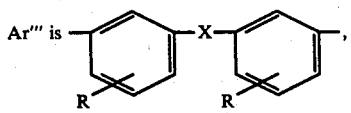

wherein R is a hydrogen atom or a methyl group; and X is an oxygen atom, a sulfur atom, a sulfonyl group, a carbonyl group, a methylene group or an ethylene group.

3. The article of claim 1, wherein Ar in the formula of the aromatic polyamide-imide is

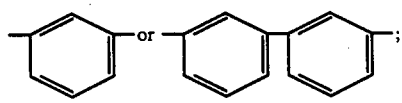

Ar' is 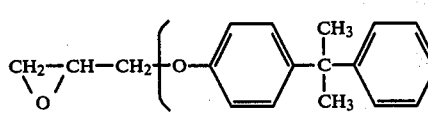 ; and

Ar" is 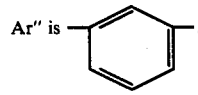 .

4. The article of claim 1, wherein the aromatic polyamide-imide has a reduced viscosity of from about 0.4 to 1.3.

5. The article of claim 1, wherein the granular material is at least one member selected from the group consisting of Au, Ag, Pd, Pt, Cu, Ni, Al, Sn and alloys thereof.

6. The article of claim 1, wherein the granular material is at least one member selected from the group consisting of Ag—PdO, Ag—PdO—Pd, NiO$_2$—Ag, C—B—Ag, Ag—PdO—Sb$_2$O$_3$, C—B, Cu$_2$O—CuO, In$_2$O$_3$, In$_2$O$_3$—Sb$_2$O$_3$, Tl$_2$O$_3$, SnO$_2$, SnO$_2$—Sb$_2$O$_3$, SnO$_2$—Ta$_2$O$_5$, MoO$_3$—B, ZnO, CdO—ZnO, RuO$_2$, TaN, TiN, TiN—Ti, TaN—Ta, WC, WC—W, C, CoSi, ZrSi, TaSi, MnSi, MoSi, NiSi and TiSi.

7. The article of claim 1, wherein the granular material is at least one member selected from the group consisting of SiO, SiO$_2$, Si$_3$N$_4$, SiC, Ta$_2$O$_3$, Al$_2$O$_3$, TiO$_2$, BaTiO$_3$, BN, BeO, CoO, PdO, B$_2$O$_3$, Bi$_2$O$_3$ and BaO.

8. The article of claim 1, wherein the polyamide-imide additionally comprises about 2 to 100 parts by weight, based on 100 parts by weight of the aromatic polyamide-imide, of an epoxy resin.

9. The article of claim 1, wherein the epoxy resin is a compound of the formula

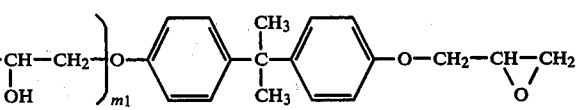

wherein m$_1$ is a number of 0 to 20.

10. The article of claim 1, wherein the epoxy resin is a compound of the formula,

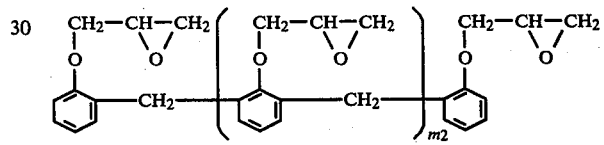

wherein m$_2$ is a number of 0 to 5.

11. The article of claim 1, wherein the polyamide-imide additionally comprises about 2 to 60 parts by weight based on 100 parts by weight of the aromatic polyamide-imide, of a silane coupling agent.

12. A composition comprising 100 parts by weight of an aromatic polyamide-imide soluble in a polar organic solvent and having a reduced viscosity of from about 0.3 to 1.5 and repeating units of the formula,

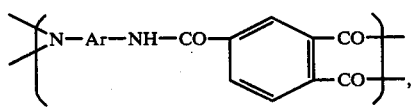

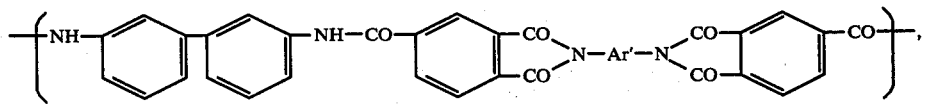

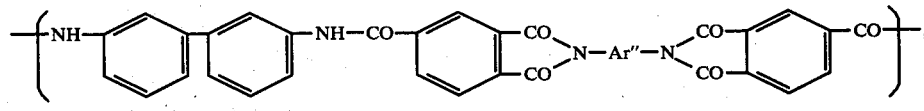

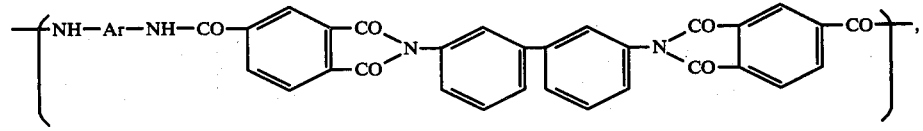

-continued

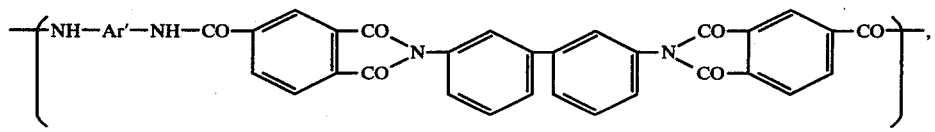

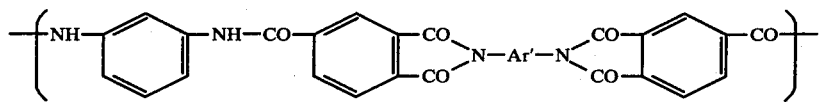

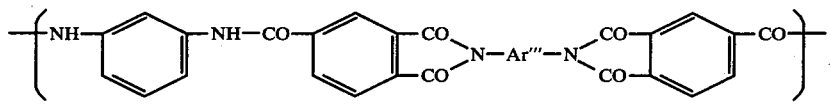

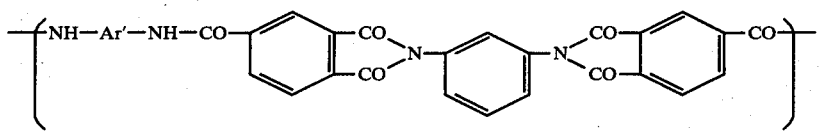

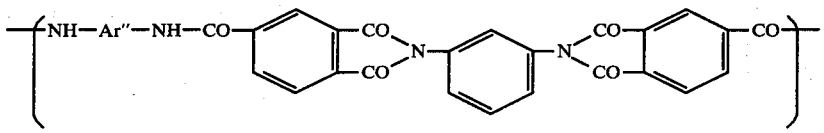

wherein Ar, Ar', Ar" and Ar''' are the same as defined in claim 1, and about 100 to 4,000 parts by weight of at least one granular material uniformly dispersed therein selected from the group consisting of metals, metal oxides, metal nitrides, metal carbides, metal silicides, silicon, silicon oxides, silicon nitrides, silicon carbide, boron, boron nitrides and carbon.

13. A composition of claim 12 comprising additionally about 10 to 10,000 parts by weight of at least one solvent selected from the group consisting of N,N-dimethylformamide, N,N-dimethylacetamide, dimethyl sulfoxide, N-methyl-2-pyrrolidone and hexamethylphosphoramide.

14. The composition of claim 13, wherein the solvent comprises at least about 5% by weight of N-methyl-2-pyrrolidone or hexamethylphosphoramide.

15. The composition of claim 13, wherein the amount of the solvent ranges from about 20 to 200 parts by weight.

16. The composition of claim 12, wherein Ar in the formula of the aromatic polyamide-imide is

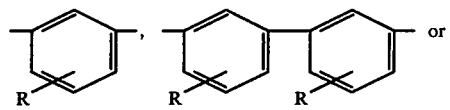

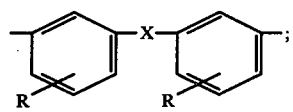

-continued

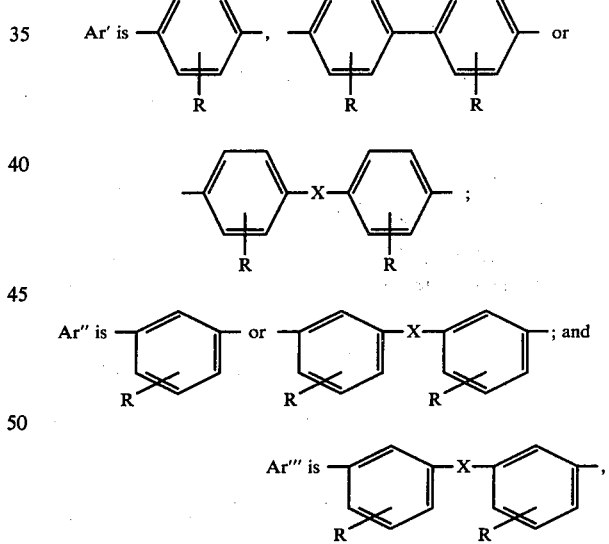

wherein R is a hydrogen atom or a methyl group; and X is an oxygen atom, a sulfur atom, a sulfonyl group, a carbonyl group, a methylene group or an ethylene group.

17. The composition of claim 12, wherein Ar in the formula of the aromatic polyamide-imide is

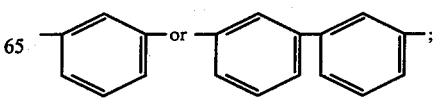

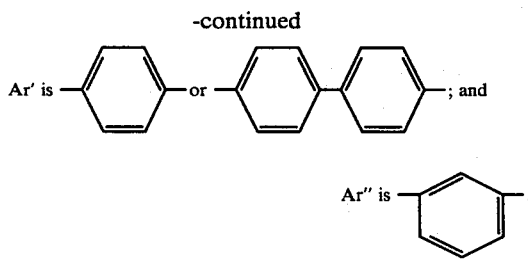

18. The composition of claim 12, wherein the aromatic polyamide-imide has a reduced viscosity of from about 0.4 to 1.3.

19. The composition of claim 12, wherein the granular material is at least one member selected from the group consisting of metals, metal oxides, metal nitrides, metal carbides, metal silicides, silicon, silicon oxides, silicon nitrides, silicon carbide, boron, boron nitrides and carbon.

20. The composition of claim 12, wherein the granular material is at least one member selected from the group consisting of Au, Ag, Pd, Pt, Cu, Ni, Al, Sn and alloys thereof.

21. The composition of claim 12, wherein the granular material is at least one member selected from the group consisting of Ag—PdO, Ag—PdO—Pd, NiO$_2$—Ag, C—B—Ag, Ag—PdO—Sb$_2$O$_3$, C—B, Cu$_2$O—CuO, In$_2$O$_3$, In$_2$O$_3$—Sb$_2$O$_3$, Tl$_2$O$_3$, SnO$_2$, SnO$_2$—Sb$_2$O$_3$, SnO$_2$—Ta$_2$O$_5$, MoO$_3$B, ZnO, CdO—ZnO, RuO$_2$, TaN, TiN, TiN—Ti, TaN—Ta, WC, WC—W, C, CoSi, ZrSi, TaSi, MnSi, MoSi, NiSi and TiSi.

22. The composition of claim 12, wherein the granular material is at least one member selected from the group consisting of SiO, SiO$_2$, Si$_3$N$_4$, SiC, Ta$_2$O$_3$, Al$_2$O$_3$, TiO$_2$, BaTiO$_3$, BN, BeO, CoO, PdO, B$_2$O$_3$, Bi$_2$O$_3$, and BaO.

23. The composition of claim 12, which additionally comprises about 2 to 100 parts by weight, based on 100 parts by weight of the aromatic polyamide-imide, of an epoxy resin.

24. The composition of claim 12, wherein the epoxy resin is a compound of the formula,

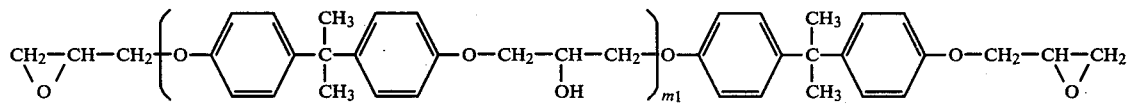

wherein m$_1$ is a number of 0 to 20.

25. The composition of claim 12, wherein the epoxy resin is a compound of the formula,

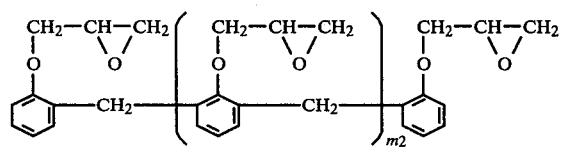

wherein m$_2$ is a number of 0 to 5.

26. The composition of claim 12, which additionally comprises about 2 to 60 parts by weight, based on 100 parts by weight of the aromatic polyamide-imide, of a silane coupling agent.

* * * * *